(12) United States Patent
Tokito

(10) Patent No.: US 7,596,040 B2
(45) Date of Patent: Sep. 29, 2009

(54) METHODS AND APPARATUS FOR IMPROVED WRITE CHARACTERISTICS IN A LOW VOLTAGE SRAM

(75) Inventor: Shunsaku Tokito, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 258 days.

(21) Appl. No.: 11/778,173

(22) Filed: Jul. 16, 2007

(65) Prior Publication Data

US 2009/0021997 A1    Jan. 22, 2009

(51) Int. Cl.
G11C 7/00    (2006.01)

(52) U.S. Cl. .............................. 365/190; 365/189.011; 365/203; 365/156

(58) Field of Classification Search .................. 365/190, 365/189.011, 203, 156
See application file for complete search history.

(56) References Cited

U.S. PATENT DOCUMENTS 6,118,689 A * 9/2000 Kuo et al. .................... 365/154

* cited by examiner

*Primary Examiner*—Son Dinh
*Assistant Examiner*—Nam Nguyen
(74) *Attorney, Agent, or Firm*—Matthew B. Dernier, Esq.; Gibson & Dernier LLP

(57) ABSTRACT

Methods and apparatus provide for writing data into and reading data from an anti-parallel storage circuit of an SRAM memory cell via a true bit line (BLT) and a complementary bit line (BLC); and preventing the complementary bit line (BLC) from substantially dropping from a pre-charge, logic high voltage level during operations in which a logic low level is written into the anti-parallel storage circuit.

10 Claims, 6 Drawing Sheets

102

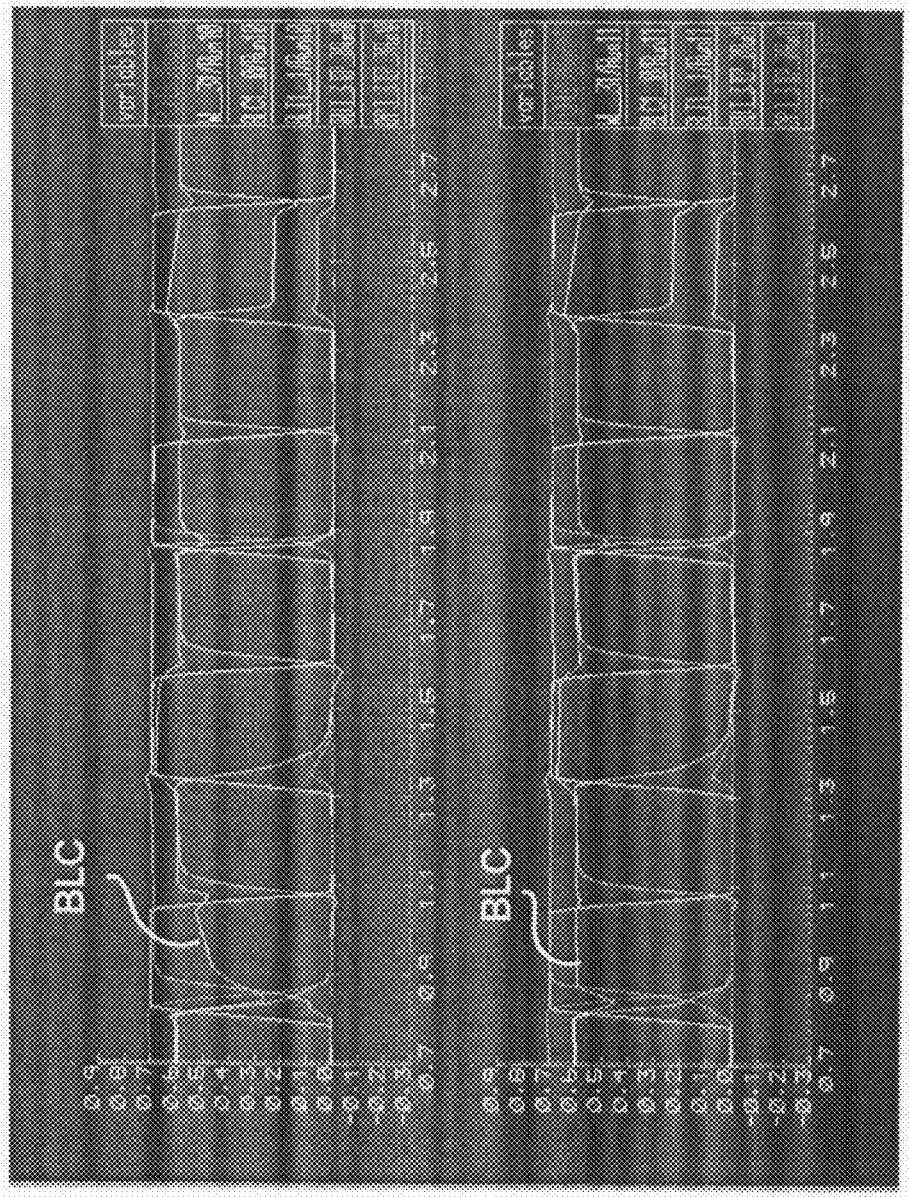

METHODS AND APPARATUS FOR IMPROVED WRITE CHARACTERISTICS IN A LOW VOLTAGE SRAM

BACKGROUND

The present invention relates to methods and apparatus for controlling static random access memory (SRAM), and in particular for improving the speed of writing data into the SRAM using novel circuit techniques.

With reference to FIGS. 1A-1B, SRAM memory cells store data in the form of complementary low voltage and high voltage at opposite sides of the cell. An SRAM, unlike dynamic random access memory (DRAM), maintains the data content of the memory calls as long as power is applied to the cell. DRAM memory cells, on the other hand, are periodically refreshed with the stored data content. An SRAM cell includes a "true" node associated with a bit line (BLT) of the SRAM memory and a complementary node associated with a complementary bit line (BLC) of the SRAM memory. When the true node is read as a high voltage, the value of the SRAM memory cell is digital one. If the true node is read as a low voltage, the value of the SRAM memory cell is a digital zero.

During write and read cycles, a conventional SRAM memory system will employ a pre-charge circuit (among the circuits labeled "other circuits") to drive the bit line BLT and the complementary bit line BLC to a power supply voltage of the SRAM memory, Vdd, before data is written to the memory cell. During the time that the data is actually written to the SRAM memory cell, a write buffer drives the bit line BLT and the complementary bit line BLC. During the read operation, the active components of the SRAM memory cell itself will drive the bit line BLT, which is sensed (using so-called evaluation circuitry) to determine the value of the stored data bit in the cell.

The conventional circuitry for accessing (or evaluating) the contents of each memory cell via the bit line BLT includes combinational logic and/or transistor circuitry to mirror the stored data value onto a global bit line (GBL). The conventional evaluation circuitry includes a portion 120 for charging the GLB and a portion 110 for interfacing a respective BLT line to the GBL. Thus, the conventional evaluation circuitry includes a plurality of interface portions (one portion for each BLT of a word line) and a single charging portion for the word line.

With reference to FIG. 1B, the conventional circuitry for implementing the BLT and BLC as well as the evaluation circuitry results in a BLC voltage potential that drops (see dashed line) well below Vdd (to about Vdd-Vth) during read and write operations, and of most interest when a logic 0 (low voltage) is written or stored in the memory cell. As will be discussed below, this drop in the BLC reduces the speed at which logic zero values can be written into the memory cell.

The problem of writing speed becomes significantly worse as the frequency of the clock increases and the size of the SRAM increases, which is an ongoing circumstance as higher and higher memory performance remains a design goal. Accordingly, there is a need in the art for a new approach to controlling SRAM memory cells in order to counteract the reduction in writing speed resulting from higher and higher clock frequencies and larger and larger SRAM memories.

SUMMARY OF THE INVENTION

In accordance with one or more embodiments of the invention, methods and apparatus provide for: an anti-parallel storage circuit operable to store a logic high or low value across a true node and a complementary node, where the true node and complementary node are coupled to a true bit line (BLT) and a complementary bit line (BLC), respectively; a write driver circuit operable to receive a write true WT input and a write complement WC input, and produce drive signals to the BLC and BLT lines; and a BLC driver operable to receive the WC input and produce a drive signal to push the BLC line to a logic high level in response to the WC input indicating that a logic low level is being written into the anti-parallel storage circuit. The drive signal from the BLC driver is separate from the write driver circuit.

The BLC driver is operable to produce the drive signal to the BLC line such that the BLC does not substantially drop from a pre-charge, logic high level during operations in which a logic low is written into the anti-parallel storage circuit. The BLC driver may include: an inverter circuit operable to receive the WC input and produce an inverted signal therefrom; and a final stage circuit operable to receive the inverted signal and to produce the drive signal to push the BLC line to a logic high level in response to the WC input.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIG. 5C is a simulation result illustrating timing relationships among numerous signals in the SRAM memory cell resulting from the pre-charge and write driver circuit of FIG. 5A.

DETAILED DESCRIPTION OF THE PRESENT INVENTION

Figure 1B:
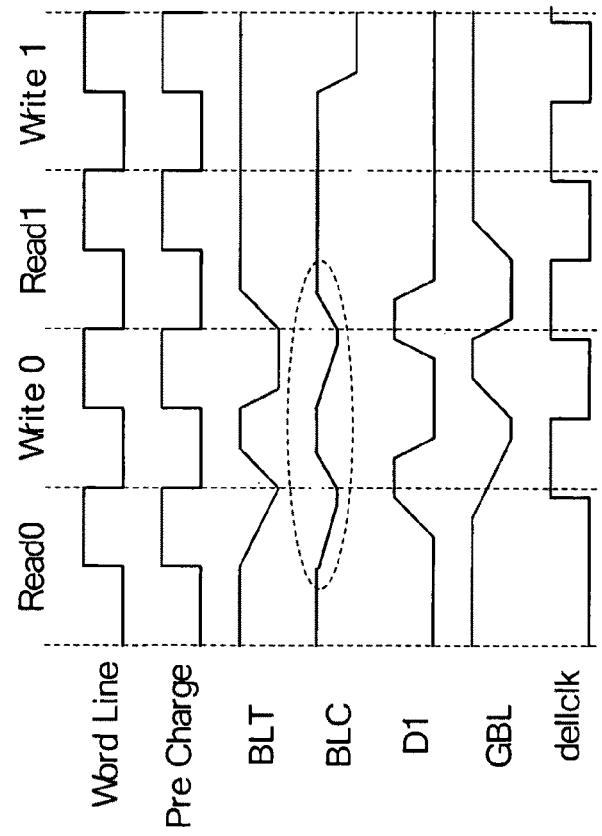
FIG. 1B is a graph illustrating timing relationships among numerous signals in the SRAM memory cell of FIG. 1A.
Figure 1A:
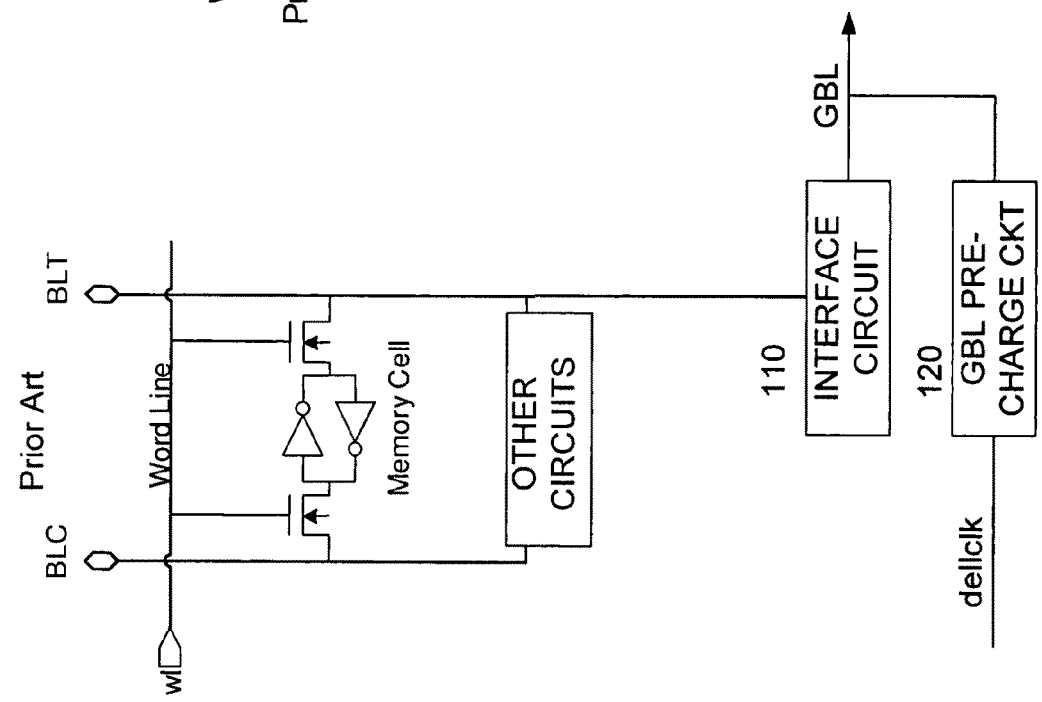
FIG. 1A is a block diagram illustrating an SRAM memory cell and evaluation circuit in accordance with the prior art.
Figure 2:
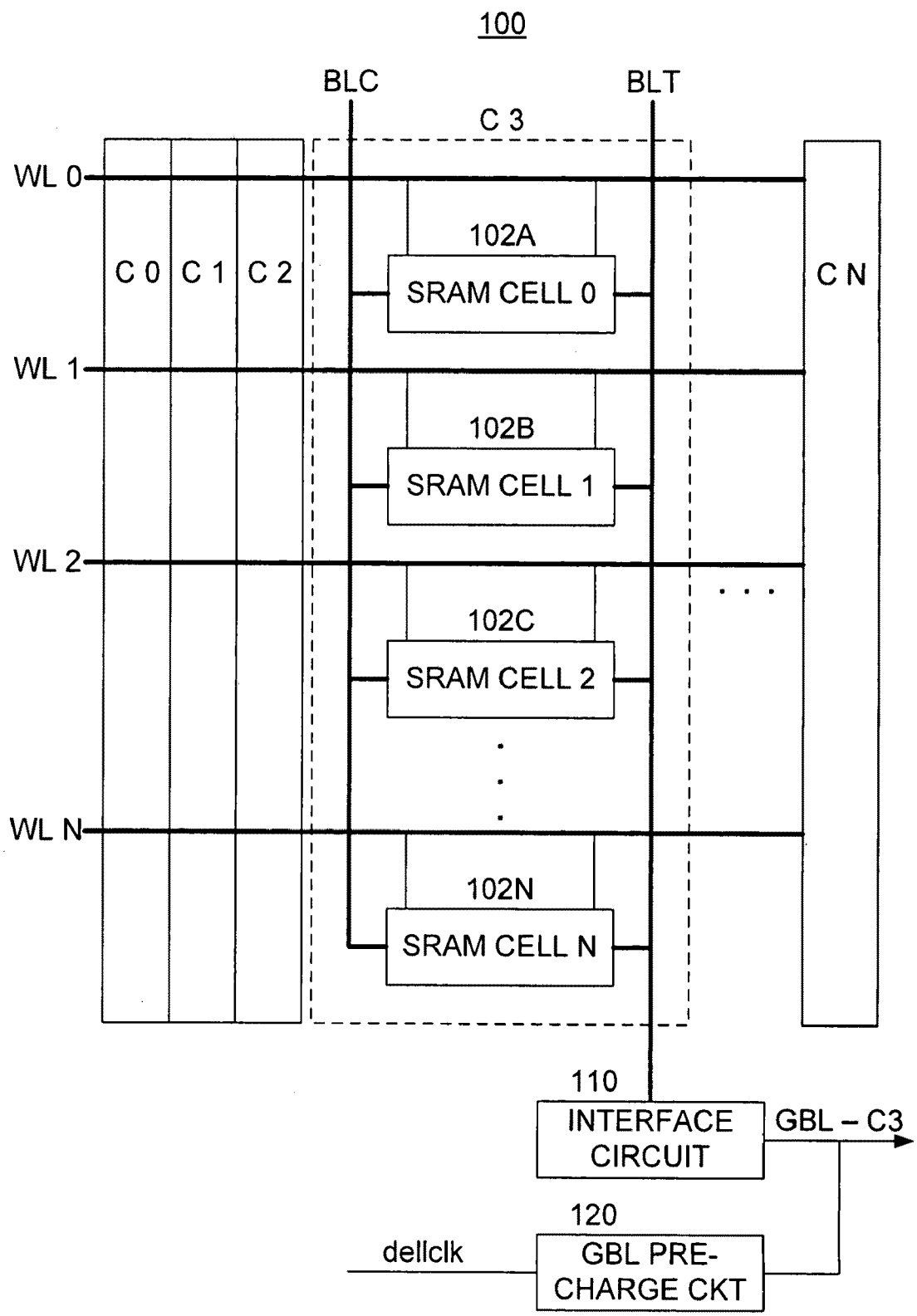
FIG. 2 is a block diagram illustrating an SRAM memory system in accordance with one or more embodiments of the present invention.

With reference to the drawings, wherein like numerals indicate like elements, there is shown in FIG. 2 an SRAM memory system 100 that may be adapted for carrying out one or more features of the present invention. For the purposes of brevity and clarity, the block diagram of FIG. 2 will be referred to and described herein as illustrating an apparatus 100, it being understood, however, that the description may readily be applied to various aspects of a method with equal force.

The SRAM memory system 100 includes a plurality of SRAM memory cells 102 arranged in an array of rows and columns. In general, each row in the array represents a word of data (such as 128 bits in width), and each column in the array represents a given bit position within each word of data. Each word on the SRAM memory system 100 is accessed by activating an associated word line (WL) and bit lines (BLC and BLT). The BLT is the "true" bit line and the BLC is the complementary bit line of the given column, e.g., C3, of the SRAM memory 100. When the true node (or true bit line) is read as a high voltage, the value of the accessed SRAM memory cell 102 is digital one. If the true node is read as a low voltage, the value of the SRAM memory cell 102 is a digital zero.

Although not shown in FIG. 2, one skilled in the art will appreciate that a number of further components of the SRAM memory system 100 may be employed, such as read and write pre-charge circuits, a write buffer (driver), feedback circuitry, and further components of a sense amplifier, etc. (Embodiments of these circuits, however, are shown and described later herein.)

An interface circuit 110 is employed to determine the logic state of the BLT, for example by sensing the voltage potential of the BLT with respect to ground during a read operation. During the read/write operation, the BLT BLC bit lines are pre-charged and then the active components of the SRAM memory cell 102 drive the BLT line, which in turn drives the interface circuit 110. The interface circuit 110 provides a higher drive capability to establish the logic value on the global bit line GBL, in this case for column three (C3) of the SRAM memory system 100. A global bit line pre-charge circuit 120 is also employed to drive the global bit line (in this case the GLB for column 3) to a pre-charge logic value in response to a clock signal (dellclk), which may be derived from the system clock.

Figure 3:
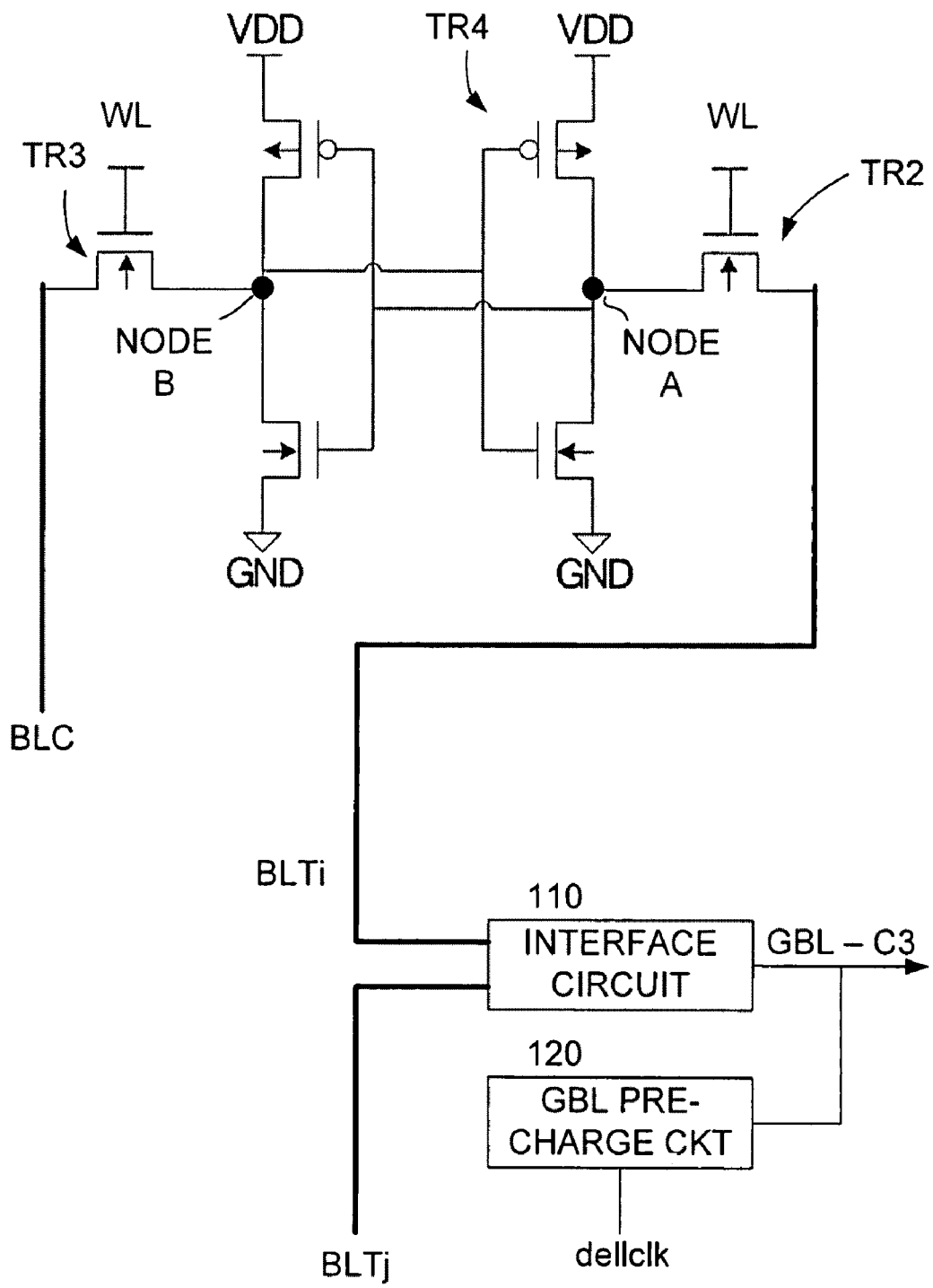
FIG. 3 is a detailed circuit schematic of an embodiment of an SRAM memory cell suitable for use with the system of FIG. 1 and other embodiments herein.

With reference to FIG. 3, a detailed circuit schematic of an SRAM memory cell 102 is illustrated that is suitable for use in the system 100. The SRAM memory cell 102 includes a pair of inverters (or gates) arranged in an anti-parallel configuration. The anti-parallel inverters are implemented using a plurality of (field effect transistors) FETs interconnected such that storage nodes A, B are associated with true bit line BLT and complementary bit line BLC, respectively. For the purposes of illustration, it is assumed that node A is a "true" node and node B is a "complementary" node, which are coupled to the true bit line BLT and the complementary bit line BLC by way of respective NMOS transistors TR2 and TR3. It is noted that while NMOS technology is a preferred implementation for transistors TR2 and TR3, other technologies may be employed without departing from the embodiments of the invention.

The NMOS transistors TR2 and TR3 are controlled by a separate word line signal WL, which also activates a plurality of SRAM memory cells used to store a single word of data. The SRAM memory cell 102 includes a PMOS transistor and an NMOS transistor connected in series across the power supply potential, Vdd to Vss (or ground). The voltage potential Vdd, may be separated from peripheral circuits to avoid noise issues and/or to achieve better stability. The true node A is located at the common connection between the PMOS and NMOS transistors. A second set of PMOS and NMOS transistors are interconnected to produce the complementary node B. Again, although this specific circuit topology and implementation is suitable for carrying out one or more embodiments of the invention, those skilled in the art will recognize from the description herein that other implementations are within the scope of the invention.

A bit of data is written to the SRAM memory cell 102 (Write 0 or Write 1) by turning on the respective NMOS transistors via the word line WL and presenting a voltage potential across the bit line BLT and the complementary bit line BLC. The voltage potential across the bit line BLT and the complementary bit line BLC is produced via a write driver circuit that will be discussed in later embodiments herein. A high voltage potential (e.g., Vdd) on the true node A and a relatively low voltage potential (e.g., ground) on the complementary node B is interpreted as a logic high or digital one (Write 1). Conversely, a relatively low voltage potential on the true node A and a relatively high voltage potential on the complementary node B is interpreted as a logic low or digital zero (Write 0). It is noted that the read and write pre-charge circuits (not shown) operate to drive the voltage on the bit line BLT and the complementary bit line BLC to certain voltage potentials prior to a read operation or a write operation to the SRAM memory cell 102.

During a write operation in which a logic high is written to the memory cell 102 (Write 1), the bit line BLT is driven to the Vdd potential and the complementary bit line BLC is driven to Vss (e.g., ground). Under these conditions, the PMOS transistor associated with the true node A will turn on, the NMOS transistor associated with the true node A will turn off, the PMOS transistor associated with the complementary node B will turn off, and the NMOS transistor associated with the complementary node B will turn on. Thus, the true node A will be substantially at the Vdd voltage potential and the complementary node B will be substantially at the Vss (or ground) voltage potential.

Those skilled in the art will appreciate that an opposite condition will be achieved during a write operation in which a logic low is written to the memory cell 102 (Write 0). The voltage potentials driving the bit line BLT and the complementary bit line BLC are reversed during a write 0 operation (as compared with a write 1 operation). The bit line BLT is driven to the Vss potential (e.g., ground) and the complementary bit line BLC is driven to Vdd. Under these conditions, the PMOS transistor associated with the true node A will turn off, the NMOS transistor associated with the true node A will turn on, the PMOS transistor associated with the complementary node B will turn on, and the NMOS transistor associated with the complementary node B will turn off. Thus, the true node A will be substantially at the Vss voltage potential and the complementary node B will be substantially at the Vdd voltage potential.

Figure 4B:
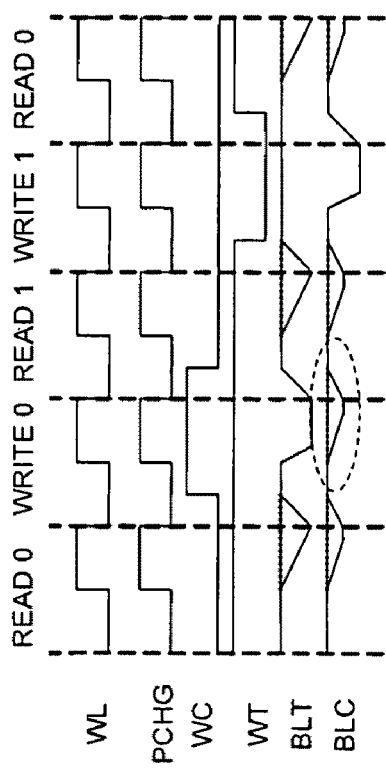
FIG. 4B is a graph illustrating timing relationships among numerous signals in the SRAM memory cell resulting from the pre-charge and write driver circuit of FIG. 4A.
Figure 4A:
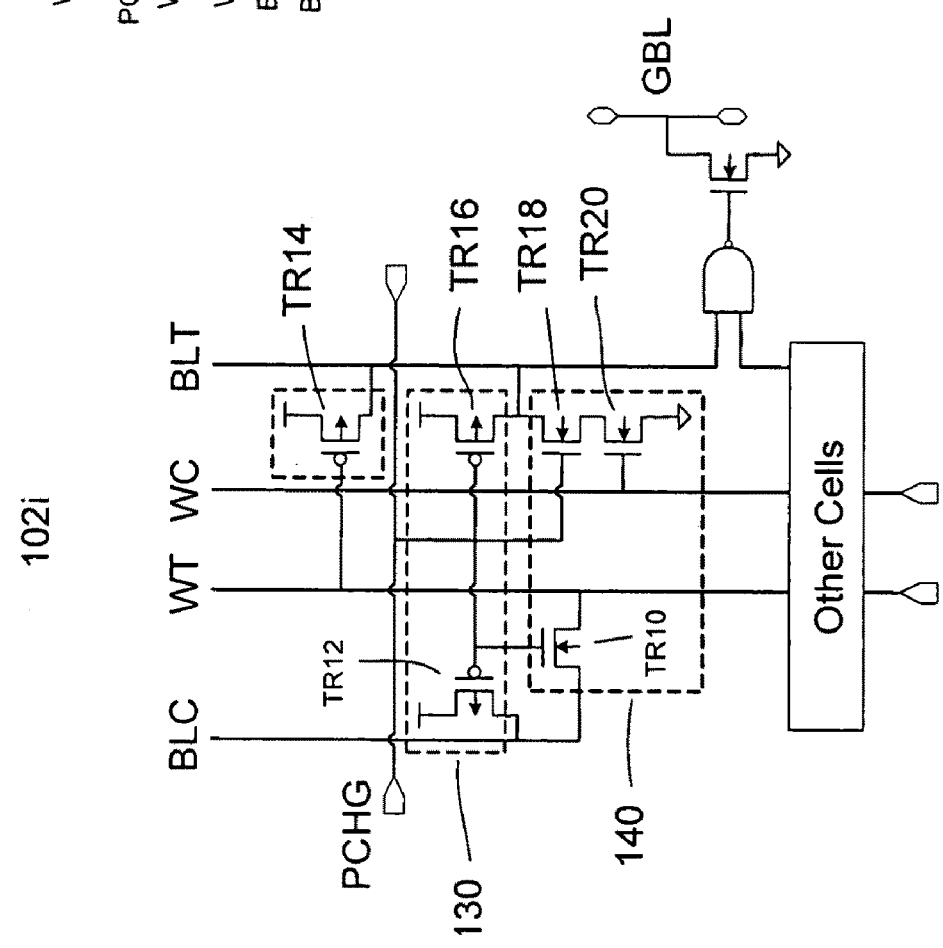
FIG. 4A is a detailed circuit schematic of a conventional pre-charge and write driver circuit.

With reference to FIGS. 3, 4A, and 4B, a discussion of a pre-charge circuit 130 and write driver circuit 140 that may be used with the SRAM memory cell 102 will now be provided. The BLC and BLT lines are driven to Vdd during a pre-charge phase of the cycle, during which the signal PCHG is low, transistors TR12 and TR16 are on, and transistors TR10 and TR18 are off.

During a read operation in which a logic low has been stored in the memory cell 102 (Read 0), the bit line BLT and the complementary bit line BLC are pre-charged to Vdd prior to the WL going high. When WL goes high, the transistors TR2 and TR3 turn on and the voltage potential between nodes A-B drives the bit line BLT towards Vss (e.g., ground). The voltage on BLT propagates through the NAND gate and the NMOS transistor to the GBL, which goes low.

During a read operation in which a logic high has been stored in the memory cell 102 (Read 1), the bit line BLT and the complementary bit line BLC are pre-charged to Vdd prior to the WL going high. When the WL goes high, transistors TR2 and TR3 turn on and the voltage potential between nodes A-B drives the bit line BLT high, which is the same level as the pre-charge potential Vdd. The voltage on BLT propagates through the NAND gate and the NMOS transistor to the GBL, which goes high.

During a write operation in which a logic high is stored in the memory cell 102 (Write 1), the WC line is low and the WT line is low. Thus, transistor TR10 is on, transistor TR12 is off and the complementary bit line BLC is driven to a logic low level (e.g., Vss). At the same time, transistor TR14 is on and the true bit line BLT is driven to a logic high level (e.g., Vdd).

During a write operation in which a logic low is stored in the memory cell 102 (Write 0), the write bit line WT and the write bit line WC are high. Thus, transistors TR18 and TR20 turn on and the bit line BLT is pulled low (e.g., to Vss). At the same time, transistor TR10 turns on, but since there are no feedback devices, the bit line BLC is supposed to go to a logic high level, i.e., Vdd, but instead drops to WT-Vth (of TR10), see FIG. 4B dashed line. If the previous data stored in the memory cell 102 was a logic high (which means the complementary node B was at a low level), the transistor TR4 (FIG. 3) still turns on due to the gate voltage thereof being at a low level. Therefore, the write time is determined by the ratio of transistors TR4, TR2, and the write driver transistor TR10. This can pose a problem when Vdd supplying transistor TR4 is relatively high and the supply voltage Vdd isolated from that of TR4 is at a low corner. Indeed, in this situation, the transistor TR4 is strong as compared to the write driver transistor TR10. Therefore it is difficult to write the data into the memory cell 102—and an unbalanced condition may arise.

Figure 5B:
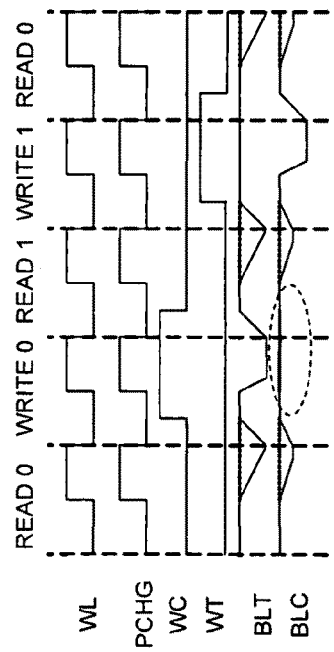
FIG. 5B is a graph illustrating timing relationships among numerous signals in the SRAM memory cell resulting from the pre-charge and write driver circuit of FIG. 5A.
Figure 5A:
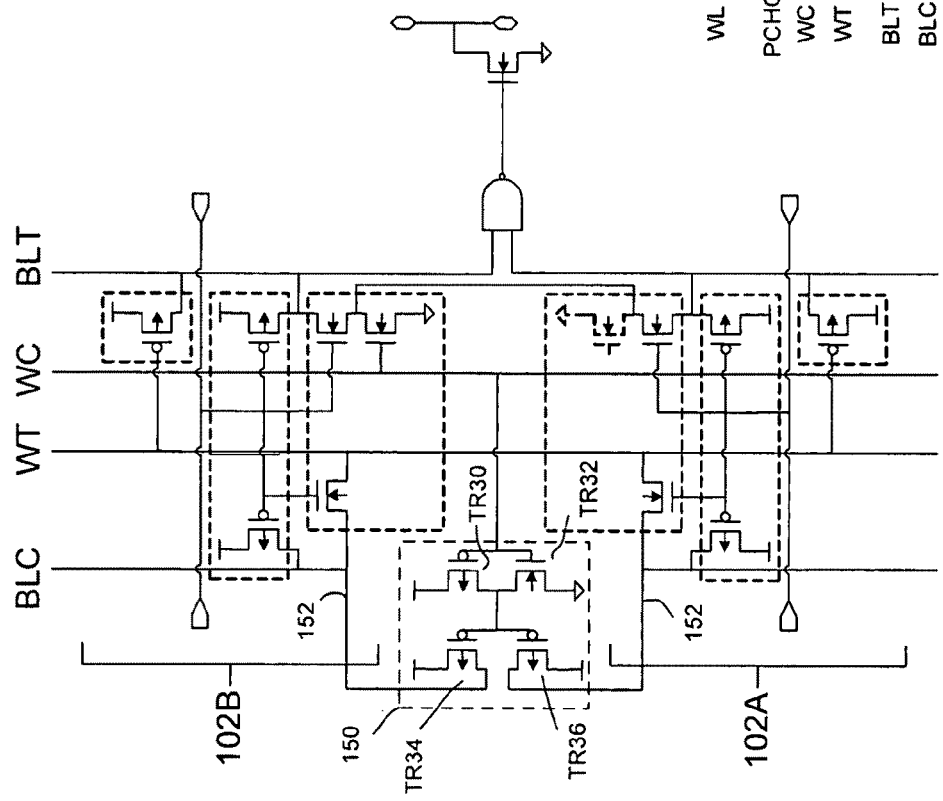
FIG. 5A is a detailed circuit schematic of cascaded pre-charge and write driver circuits employing an additional circuit in accordance with one or more embodiments of the present invention.

With reference to FIGS. 5A and 5B, the memory cells 102 of an SRAM memory system may include a BLC driver 150 operable to receive the WC input and produce a drive signal 152 to push the BLC line (e.g., of cell 102B) to a logic high level in response to the WC input indicating that a logic low level is being written into the anti-parallel storage circuit. Indeed, using the BLC driver circuit 150, the BLC line does not drop to WT-Vth, as shown in the dashed line of FIG. 5B.

The BLC driver circuit 150 includes transistors TR30, TR32, TR34, and TR36. TR30 and TR32 are coupled in series and form an inverter circuit operable to receive the WC input and produce an inverted signal therefrom. TR34 forms at least a portion of a final stage circuit operable to receive the inverted signal and to produce the drive signal to push the BLC line (of cell 102B) to a logic high level in response to the WC input. TR36 forms at least another portion of the final stage circuit operable to receive the inverted signal and to produce the drive signal to push another BLC line (of cell 102A) to a logic high level in response to the WC input.

With reference to FIG. 5B, during a Write 0, the WC line is high, transistor TR30 is off, transistor TR32 is on, and transistors TR34 and TR36 are on. Transistors TR34 and TR36 drive the complementary bit lines BLC of cells 102A and 102B to a logic high level (e.g., Vdd) and prevent any drop in level. During a Read 0, Read 1 and Write 1, the WC line is low, transistor TR30 is on, transistor TR32 is off, and transistors TR34 and TR36 are off. Thus, the BLC driver circuit 150 has no affect on the BLC lines.

FIG. 5C is a further illustration of the operation of the BLC driver circuit 150. The graph in FIG. 5C is the result of a circuit simulation comparing the memory cell operation of FIG. 5A with and without the BLC driver circuit 150. Again, during a Write 0 operation, transistors TR34 and TR36 drive the complementary bit line BLC to a logic high level (e.g., Vdd) and prevent any drop in level.

The BLC driver circuit 150 has a substantial affect on the writing speed of a given memory cell 102. Through simulation tests, it has been determined that three different designs protocols would result in a faster Write 0 speed if the BLC driver circuit 150 is employed:

|  | without BLC driver | with BLC driver |
|---|---|---|
| 11S Design | 35 ps | 32 ps |
| Caddy Design | 54 ps | 47 ps |
| Lincoln Design | 30 ps | 22 ps |

The 11S design simulation also revealed that in the isolated Vdd scenario (where the Vdd1 for the anti-parallel storage circuit is separate from the Vdd2 for the write driver and pre-charge circuit), a high Vdd1 versus low Vdd2 resulted in the following: 34 ps (without the BLC driver) and 32 ps (with the BLC driver). In a worst case scenario, the 11S design simulation resulted in the following: 63 ps (without the BLC driver) and 55 ps (with the BLC driver). The Lincoln design simulation revealed that in the isolated Vdd scenario the following simulation resulted: 58 ps (without the BLC driver) and 40 ps (with the BLC driver).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An SRAM cell, comprising:
    an anti-parallel storage circuit operable to store a logic high or low value across a true node and a complementary node, where the true node and complementary node are coupled to a true bit line (BLT) and a complementary bit line (BLC), respectively;
    a write driver circuit operable to receive a write true WT input and a write complement WC input, and produce drive signals to the BLC and BLT lines; and
    a BLC driver operable to receive the WC input and produce a drive signal to push the BLC line to a logic high level in response to the WC input indicating that a logic low level is being written into the anti-parallel storage circuit,
    wherein the drive signal from the BLC driver is separate from the write driver circuit.

2. The SRAM cell of claim 1, wherein the BLC driver is operable to produce the drive signal to the BLC line such that the BLC does not substantially drop from a pre-charge, logic high level during operations in which a logic low is written into the anti-parallel storage circuit.

3. The SRAM cell of claim 1, wherein the BLC driver includes:
    an inverter circuit operable to receive the WC input and produce an inverted signal therefrom; and
    a final stage circuit operable to receive the inverted signal and to produce the drive signal to push the BLC line to a logic high level in response to the WC input.

4. The SRAM cell of claim 1, wherein the BLC driver includes the following circuit:

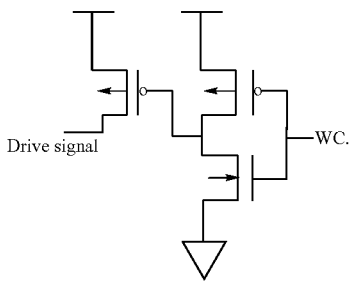

5. An SRAM memory, comprising:
at least two memory cells, each including: (i) an anti-parallel storage circuit operable to store a logic high or low value across a true node and a complementary node, where the true node and complementary node are coupled to a true bit line (BLT) and a complementary bit line (BLC), respectively, and (ii) a write driver circuit operable to receive a write true WT input and a write complement WC input, and produce drive signals to the BLC and BLT lines; and
a BLC driver operable to receive the WC input and produce respective drive signals to push the respective BLC lines to a logic high level in response to the WC input indicating that a logic low level is being written into the anti-parallel storage circuits,
wherein the drive signals from the BLC driver is separate from the write driver circuits.

6. The SRAM memory of claim 5, wherein the BLC driver includes:
an inverter circuit operable to receive the WC input and produce an inverted signal therefrom; and
a final stage circuit operable to receive the inverted signal and to produce the respective drive signals to push the respective BLC lines to a logic high level in response to the WC input.

7. The SRAM memory of claim 1, wherein the BLC driver includes the following circuit:

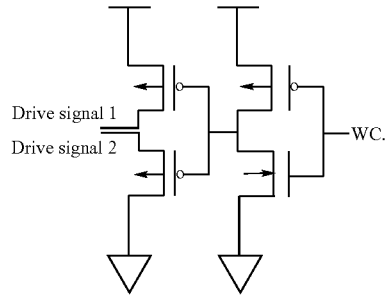

8. A method, comprising:
writing data into and reading data from an anti-parallel storage circuit of an SRAM memory cell via a true bit line (BLT) and a complementary bit line (BLC); and
preventing the complementary bit line (BLC) from substantially dropping from a pre-charge, logic high voltage level during operations in which a logic low level is written into the anti-parallel storage circuit.

9. The method of claim 8, comprising: producing a drive signal to push the BLC line to a logic high level in response to a write complement WC input indicating that a logic low level is being written into the anti-parallel storage circuit.

10. The method of claim 9, wherein the drive signal to push the BLC line to a logic high level is separate from one or more signals from any write driver circuit.

* * * * *